United States Patent

Konrad et al.

[11] Patent Number: 5,945,802
[45] Date of Patent: Aug. 31, 1999

[54] GROUND FAULT DETECTION AND PROTECTION METHOD FOR A VARIABLE SPEED AC ELECTRIC MOTOR

[75] Inventors: Charles E. Konrad; Robert M. Gamber, both of Roanoke, Va.; Massimo Polo, Preganziol, Italy

[73] Assignee: General Electric Company, Schenectady, N.Y.

[21] Appl. No.: 08/966,289

[22] Filed: Nov. 7, 1997

Related U.S. Application Data

[63] Continuation-in-part of application No. 08/723,202, Sep. 27, 1996, Pat. No. 5,883,489.

[51] Int. Cl.$^6$ .................................................. H02P 5/40
[52] U.S. Cl. .......................... 318/807; 318/805; 318/810; 318/490; 417/36; 417/22; 361/42
[58] Field of Search ..................................... 318/807, 805, 318/810, 227, 800–829, 729, 778, 798, 705, 430–434, 447, 606, 424, 723; 166/68.5; 417/53, 424, 42–45; 361/23–30, 31, 32, 33; 415/501

[56] References Cited

U.S. PATENT DOCUMENTS

| | | |
|---|---|---|
| 2,972,708 | 2/1961 | Schaeffer . |
| 3,283,236 | 11/1966 | Legg . |
| 3,417,290 | 12/1968 | Craddock . |
| 3,577,052 | 5/1971 | Bauer ........................................ 318/230 |
| 3,976,919 | 8/1976 | Vandevier et al. .......................... 361/31 |
| 4,000,446 | 12/1976 | Vandevier et al. .......................... 361/31 |
| 4,021,700 | 5/1977 | Ellis-Anwyl . |
| 4,200,829 | 4/1980 | Pohl . |
| 4,224,652 | 9/1980 | Fiorentzis . |
| 4,242,712 | 12/1980 | Doll . |
| 4,284,943 | 8/1981 | Rowe . |
| 4,523,248 | 6/1985 | Schmale . |
| 4,618,810 | 10/1986 | Hagerman et al. ....................... 318/803 |
| 4,716,487 | 12/1987 | Horvath et al. ............................ 361/42 |
| 5,160,244 | 11/1992 | Kuwabara et al. . |
| 5,350,992 | 9/1994 | Colter . |
| 5,386,183 | 1/1995 | Cronvich et al. . |
| 5,508,620 | 4/1996 | Pfiffner . |
| 5,580,221 | 12/1996 | Triezenberg . |

*Primary Examiner*—Paul Ip
*Attorney, Agent, or Firm*—Wayne O. Traynham; James H. Beusse

[57] ABSTRACT

A method and apparatus for detecting the presence of a ground leakage path in an electric motor system including an alternating current (ac) electric motor coupled for receiving electric power from a switching inverter of the type having, for each phase of the motor, a pair of serially connected electronic switching devices connected between relatively positive and negative direct current (dc) voltage buses with the switching devices being alternately gated into and out of conduction for providing switched electric power to the motor. The inverter includes a current detector for detecting current in the relatively negative voltage bus. The method comprises initially applying a gating pulse each time the motor is energized to the switching device of each phase connected to the negative voltage bus and identifying a ground leakage path when such gating pulse produces current at the current detector. Preferably, the first gating pulse is of very short time duration and the process of applying gating pulses is repeated for each of a plurality of continuously increasing pulse widths until a selected maximum width is attained without generating current. Thereafter, the motor is started in a conventional manner.

14 Claims, 3 Drawing Sheets

GROUND FAULT DETECTION AND PROTECTION METHOD FOR A VARIABLE SPEED AC ELECTRIC MOTOR

CONTINUING DATA AS CLAIMED BY APPLICANT

This application is a continuation-in-part of U.S. patent application Ser. No. 08/723,202, filed Sep. 27, 1996, now U.S. Pat. No. 5,883,489, and assigned to assignee of the present invention.

BACKGROUND OF THE INVENTION

This disclosure relates to a variable-frequency induction motor drive system and, more particularly, to such a system in combination with a submersible water pump.

Deep well, residential service, submersible pumps presently available in the market are driven with two pole, alternating current (ac) induction motors which have been packaged to survive immersion in the well. The stator portion of the motor is encapsulated with an epoxy (or other suitable material) making it impervious to moisture. A substantial length of electric wire must be connected to the motor leads to provide power to the motor when it is operating at depths of up to 400 feet. The installer of the pump system must make this connection, and is interested in providing a waterproof connection to avoid ground leakage paths. Installation instructions stress the importance of waterproofing these connections, and of testing for ground leakage before power is applied to the system. However, it is reasonable to assume that errors will occur, and periodically, power will be applied while ground leakage paths are present.

The conventional pumping systems for residential wells are supplied with power from a branch circuit breaker which does not include a ground fault interrupter (GFI). The power lines are connected through a pressure switch (two pole, single throw) to the two input terminals of a single phase motor. The total wire lengths between the pressure switch and the motor may be as much as 500 feet with a portion of the length buried in the ground, and the remainder submerged in the well. When the system pressure falls below a preset level, the pressure switch closes, connecting each side of the power line to one of the two motor terminals.

The most popular motor in the conventional system is a ¾ hp single phase induction motor, and is supplied from a single phase, 230 volt, 60 cycle source of power. The power system is center grounded, i.e., the electrical potential of each of the two conductors supplying power to the pressure switch is 115 volts above ground. It is well known that cracks or other imperfections in the motor assembly which allow the ingress of water lead to ground leakage of electrical current, and may ultimately cause a direct ground fault. In addition, any contact between the well water and the conductors bringing power from the well head to the submerged motor will also lead to electrical leakage between the power system and ground. That portion of wiring between the pressure switch and the well head is also susceptible to ground leakage. The three most common sources of ground faults in these systems are 1) loss of insulation integrity in the motor stator, 2) exposure of the power conductors to well water at the connection points, and 3) nicks in the insulation which occur as the pump is being lowered into the well. If the branch breaker in the conventional system includes a GFI function, then the breaker will detect the ground leakage current when the pressure switch closes and will trip, alerting the resident that a ground fault exists. If the branch circuit breaker does not include the GFI function, then the system will continue to operate until the ground leakage reaches a level great enough to trip the breaker from overcurrent. In a conventional system such as this, additional component failure resulting from ground faults in the wiring between the pressure switch and the motor is unlikely.

There are several deficiencies with the present conventional system commercially available including, for example, the following: (1) a four inch pump-motor diameter requires a five inch well casing at a substantial well drilling cost; (2) if a well is pumped dry, the pump may be damaged because the bearings are lubricated and cooled by the water, and the lack of water can lead to bearing failure unless a flow restrictor is added to the waterline at the well head to prevent the output flow from exceeding the well recovery rate; (3) sand, stone chips or other debris in the well may cause the pump to seize or bind leading to a stalled motor condition that may cause motor overheating and damage; (4) if the line voltage is low, the motor is forced to operate at less than the rated magnetic flux, thus requiring more current to produce the same torque leading to motor overheating and the possibility of eventual failure; (5) starting the motor by connecting across the AC power line results in a significant surge in input current with each start and frequent restarts, such as those experienced when power is frequently interrupted during thunder storms, can also lead to motor overheating and failure; and (6) because of the heating penalty associated with each start, the hysteresis in the pressure switch must be increased to a value great enough to ensure that the motor doesn't restart too frequently forcing the homeowner to endure pressure variations of a much as 50% between pump starts.

An improved pumping system which addresses these deficiencies is disclosed in U.S. patent application Ser. No. 08/723,202, now U.S. Pat. No. 5,883,489, entitled "High Speed Deep Well Pump for Residential Use" This system employs a solid-state power unit for converting 230 volt, single phase, 60 Hz power to 230 volt, three phase, variable frequency power allowing the pump motor speed to be controlled between zero and 10,000 revolutions per minute. Such a pumping system can overcome the deficiencies pointed out above while providing a superior pressure regulated water supply where variations in pressure are restricted to much lower levels, and intelligence implicit in the microcontroller software can detect the existence of control problems, take appropriate protective measure, and alert the homeowner of the problem. However, the existence of a ground fault condition poses particular problems for such a system.

FIG. 2 is a schematic representation of the power circuit disclosed in the aforementioned U.S. patent application Ser. No. 08/723,202, now U.S. Pat. No. 5,883,489, for supplying power to a submersible pump in a residential water system. The power source is a 230 volt, single phase, center grounded, 50/60 Hz source which is connected to a bridge rectifier comprised of diodes 16, 18, 20, and 22. This rectifier converts the 50/60 Hz source to full-wave rectified power. The output of the bridge rectifier connects to positive and negative buses 24, 25. A capacitor 26 is connected between the two buses to smooth the power minimizing the effects of the ripple voltage inherent in the full wave rectified power source. A three phase bridge arrangement 27 of power switching devices 28, 30, 32, 34, 36 and 38, which are typically either Insulated Gate Bipolar Transistors (IGBT) or Field Effect Transistors (FET) are used to convert the filtered output of the bridge rectifier into a source of variable voltage, variable frequency power to control the speed and torque of the induction motor in a manner well known in the art. The output of the three phase bridge 27 is a balanced three phase voltage which may be either a sine wave or a square wave where the volt-seconds of each cycle is maintained constant through the well known principle of pulse width modulation (PWM). It should be noted that a power diode is connected in an inverse parallel arrangement across each of the power switches in the three phase bridge to provide a path for reverse current flow through each switch position, and is not shown in FIG. 2 for simplicity. A current sensing resistor 29 is connected in the negative bus between the filter capacitor 26 and the three phase bridge to provide a controller 42 with the signals necessary for protection and regulation functions.

The three phase bridge switching devices (IGBT/FET) have a rapid turn-on characteristic, typically between 15–100 nanoseconds, and the result is a rapidly rising current wave front through the current sensing resistor 29 and due to the parasitic inductance of this resistor, a voltage spike appears across the resistor 29 during the switching interval. The current regulating system interprets voltage across the sense resistor 29 as an analog of current, and the voltage spike is erroneously interpreted as a rapidly rising overcurrent leading to an incorrect response by the current protection system. A filter comprised of resistors 84 and 86, and capacitor 87 must be added to the system to prevent the overcurrent protection function from invoking an incorrect response. The selection of component values for this filter are a design tradeoff between maintaining rapid overcurrent protection, and avoiding nuisance overcurrent trips. However, the presence of the filter always leads to a delay in the current sense signal making it difficult to provide the speed necessary to protect the switching devices 28–38 should a short circuit occur in the output circuitry.

The phantom line 39 indicates a ground in one of the motor leads for illustrative purposes. This ground may be the result of nicked insulation, poorly insulated motor terminal connections, or a motor stator leakage to ground. It may also be a high impedance leakage path, or a solid low impedance path. Assuming that a short to ground exists prior to motor start up, and further that the input power line is of the indicated polarity, then the gating of a positive power device, such as 32, will result in a short circuit from the positive power terminal 12 through diode 16, power switch 32, through the leakage path 39, through the power circuit ground and returned to the negative side of the power source. This results in 115 volts(ac) being applied to the circuit described. Note in particular that this path does not include the current sensor 29 and hence the control would have no way of knowing that the short circuit had occurred, and the failure of one or more positive side power switches will likely result long before any protective functions can be activated.

Assuming, however, that the first power switch to be gated is a negative side cell such as 38, the short circuit loop initiated when switch 38 is gated is from voltage source lead 14 through the system ground, through the leakage path 39, through switch 38, current sensor 29, and diode 22. This path includes the current sensor 29 and the fault current can theoretically be detected. However, if the short circuit is a very low impedance, the current in the loop will rise so rapidly that the delays in the filter described above will allow the current to rise to levels adequate to destroy the power switch 38 before the current protection function has time to work. Thus, it can be seen that gating of a positive side switch will result in its destruction because the current path does not include a current sensor, and the gating of a negative side cell may result in its destruction because of delays introduced into the protection function to avoid nuisance trips or false shutdowns. Accordingly, it is desirable to provide a method for detecting ground leakage paths prior to applying full power to the three phase bridge.

SUMMARY OF THE INVENTION

Among the several objects of the present invention may be noted the provision of a method and apparatus for detecting ground faults in an electric motor power system and the provision of a method and apparatus for detecting such ground faults prior to applying full electric to the system. In an illustrative form, the invention is implemented in a microprocessor based controller for an electric power system for a multiphase electric motor in a water well pumping system. The power system includes a multiphase bridge circuit operable as a PWM inverter to supply controlled frequency power to the motor in order to regulate motor speed over a broad range. Since, as discussed above, gating of any of the switching devices in the inverter into normal conduction can result in failure of the system, the invention is based upon the recognition that in the absence of a ground leakage path, the gating of a negative side switch will result in NO current flow. This includes the false current signal which results from the fast switching nature of the power switch coupled with the inductance inherent in the current sensor. In the circuit arrangement described in this invention, each time before the motor is started, each switching device connected to the negative voltage bus is gated with a test pulse of relatively short duration, e.g., less than one millisecond. Sufficient delay is inserted between the gating of each switching device to allow time for the current measuring system to respond. The gating pulse to each of the negative switching devices is of a sufficiently short duration to prevent any fault current from reaching a level which would damage the switching device. If no current is detected with the first short test pulse, a second set of gating pulses is applied with a longer duration to permit a check for a higher resistance leakage path. If no current flow is detected with the second set of gating pulses, it is assumed that no ground leakage path exists and the controller proceeds to power the motor.

BRIEF DESCRIPTION OF THE DRAWINGS

For a better understanding of the present invention, reference may be had to the following detailed description taken in conjunction with the accompanying drawings in which.

DETAILED DESCRIPTION OF THE INVENTION

Figure 1:
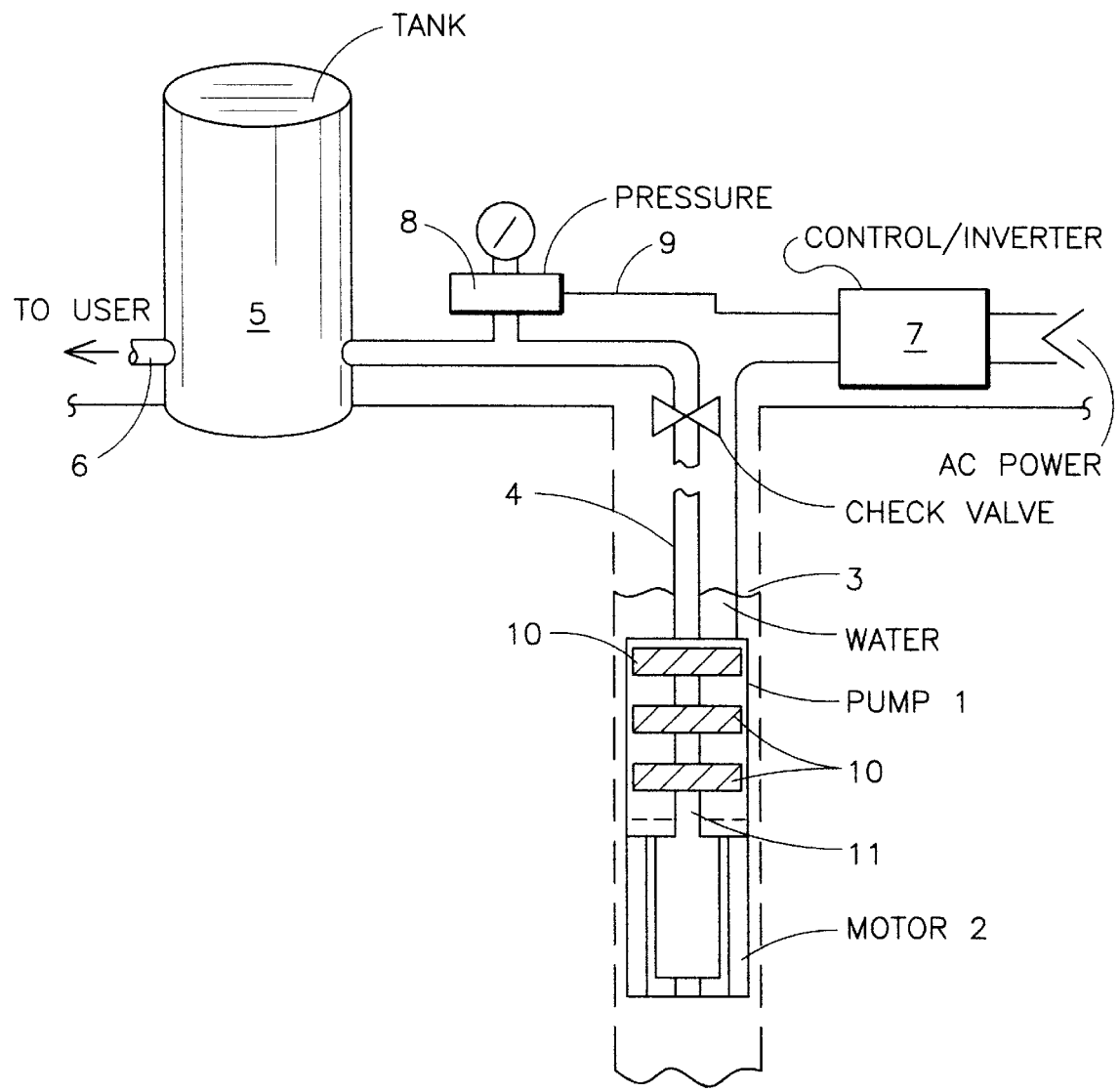
FIG. 1 is a simplified illustration of a conventional water pumping system with which the present invention may be used.

FIG. 1 illustrates an exemplary deep well pumping system including a pump 1 and AC induction motor 2 located within a bore 3 at a depth which may be as deep as about 400 feet. Water in the bore 3 can be pumped through pipe 4 to a bladder type storage tank 5 from where it is distributed to a residential user via pipe 6. A control 7 responds to water pressure signals from pressure sensor 8 via line 9 for providing variable frequency AC excitation to motor 2. The control 7 receives power from conventional AC power utility lines. When water pressure is less than some preselected low set point, the sensor 8 provides a first signal which causes the control 7 to energize pump motor 2. When water pressure rises above some preselected high set point, sensor 8 provides a second signal which causes control 7 to remove excitation from motor 2.

Figure 2:
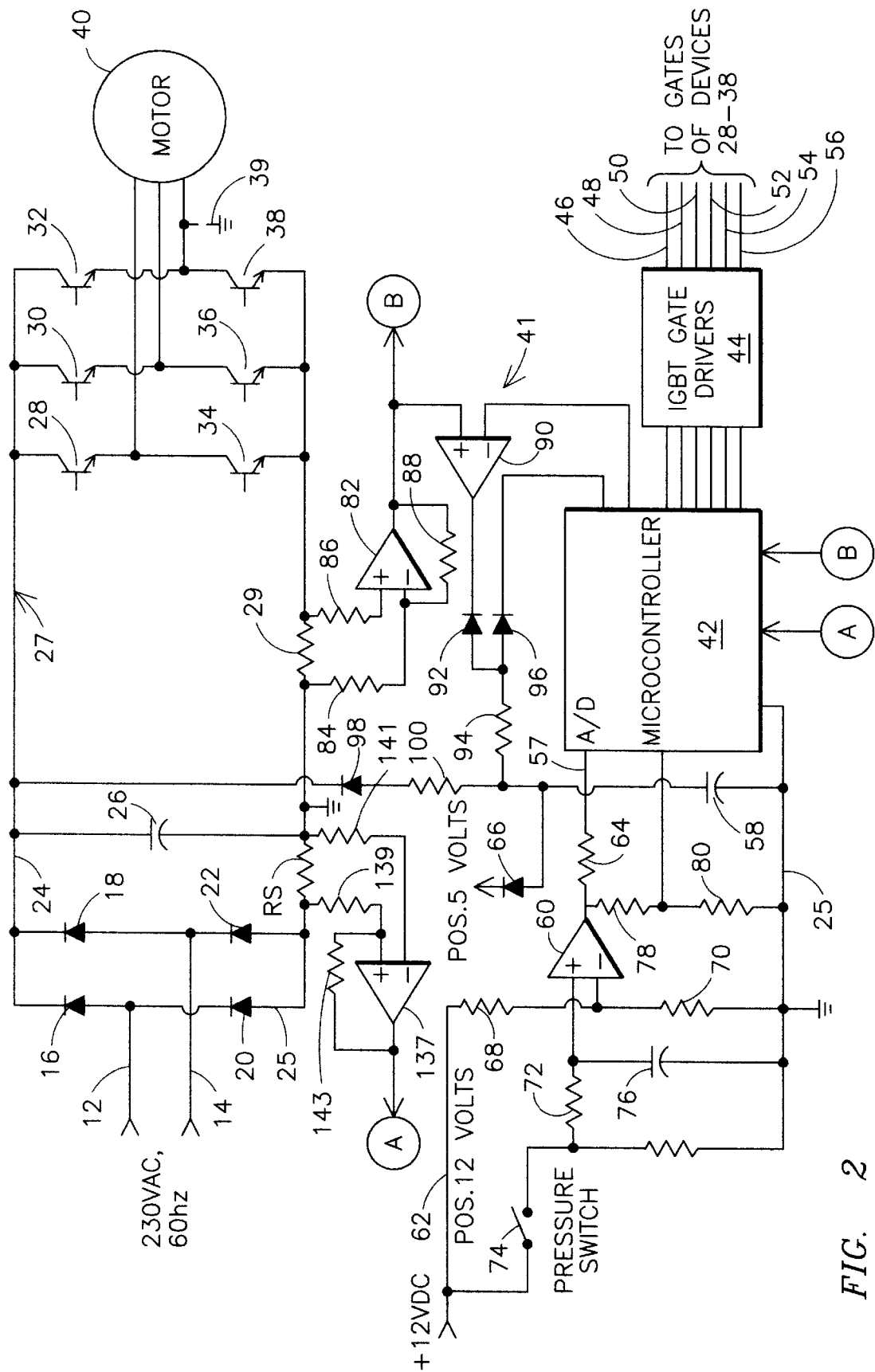
FIG. 2 is a simplified electrical schematic diagram of a control system for the water pumping system of FIG. 1 incorporating the teachings of the present invention.

Turning now to FIG. 2, there is shown a simplified schematic diagram of a motor power circuit and controller for use as control 7 in the system of FIG. 1. The power circuit is coupled to AC power from a conventional utility electrical system supplying a nominal 220 VAC at 60 Hz (although it should be noted that a source of 300 volts DC is also usable) via the two power input mains 12,14 connected to AC input points on a bridge rectifier circuit comprised of diodes 16, 18, 20 and 22. The cathode terminals of diodes 16, 18 are connected to a positive bus 24, and the anode terminals of diodes 20, 22 are connected to a negative bus 25. A bus filter capacitor 26 is connected between the positive bus and the negative bus to allow a path for reactive power flow from an inductive load, i.e., all of the power flow in the negative and positive bus rails on the left side of the capacitor 26 (rectifier to capacitor) is real power while the power flow in the positive and negative rails on the right side of the capacitor 26 (capacitor to load circuit) is comprised of both real and reactive power components. The positive bus 24 is connected to a positive voltage side of an output power bridge 27 comprised of six power devices 28,30,32,34,36 and 38. A negative voltage side of the power bridge 27 is connected to the negative bus 25 via a current sensing resistor 29. The output of the power bridge is connected to the three phase leads of an induction motor 40 representing a reactive load. The rectifier circuit converts the AC line voltage to full wave rectified voltage on bus 24 referenced to bus 25. The power bridge 27 can be operated as an inverter to convert the voltage between buses 24 and 25 to a controlled frequency AC voltage for controlling the speed of motor 40. Bridge 27 can also convert AC power from motor 40 (if motor 40 is operated in a regenerative mode) into DC power which is coupled back into the DC buses 24, 25.

The output power bridge 27 is controlled by a control circuit 41 which includes a microcontroller 42 which supplies gate drive signals to the six power devices 28–38 via an integrated gate driver circuit 44. Three gate drive signal lines 46,48,50 are connected from driver circuit 44 to the three power devices 28,30,32 connected to the positive DC bus 24 and require a source of power which is isolated from the negative bus 25 such as by use of an isolation transformer or other means well known in the art. Three drive signal lines 52,54,56 are connected from driver circuit 44 to the three power devices 34,36,38 which are referenced to the negative side of the output power bridge and do not require isolation.

The microcontroller 42 is supplied with an input signal at A/D input line 57 from a capacitor 58 whose voltage is representative of the desired speed of motor 40. A software program executed by the microcontroller 42 translates the capacitor 58 voltage into a proportional frequency. The microcontroller 42 develops, from the frequency conversion, a set of pulse width modulation (PWM) signals for controlling the switching devices of the output power bridge or inverter 27. The PWM signals are developed in a well known manner by microcontroller 42 and serve to gate the switching devices into and out of conduction in a manner to generate three-phase output power for application to motor 40 wherein the output waveforms appearing at the power input terminals of motor 40 have an approximate sinusoidal configuration at the frequency set by the microcontroller 42. The switching devices may be insulated gate bipolar transistors (IGBT), gate turn-off devices (GTO) or other suitable electronic switching elements. The amplitude of the three-phase voltage applied to motor 40 is controlled such that the root-mean-square (RMS) amplitude of the line-line voltage supplied to the power input terminals of motor 40 is a constant multiplied by the frequency so that the motor is operated in a constant volts per hertz mode. Hence, basic control of the motor 40 involves control of the voltage on capacitor 58.

A differential amplifier 60 provides the basic drive for charging and discharging capacitor 58 to start, accelerate, decelerate, and stop the motor 40. When the voltage at the non-inverting input terminal of amplifier 60 is higher than the voltage at its inverting input terminal, the amplifier output goes to approximately 12 volts, i.e., the voltage on positive bus 62. The capacitor 58 is connected to the output terminal of amplifier 60 through a charging resistor 64 and begins charging toward the amplifier 60 output voltage via resistor 64. However, the capacitor 58 is also connected via a diode 66 to a lower voltage bus 68, e.g., a 5 volt bus. When the voltage on capacitor 58 reaches 5 volts, the diode 66 becomes forward biased and prevents the capacitor voltage from exceeding a level of 5 volts or whatever lower voltage is on bus 68. This combination of charging toward a final voltage of 12 volts, and clamping when the level reaches a preselected lower voltage, such as 5 volts, results in an approximately linear operation during the charging process. In a similar process, when the voltage at the non-inverting input terminal of amplifier 60 falls below the voltage at the inverting input terminal, the amplifier 60 output is switched to near zero volts and the capacitor begins to discharge towards zero volts.

The inverting input terminal of differential amplifier 60 is connected to a junction point of a voltage divider comprising resistors 68 and 70 which are serially connected between the positive 12 volt bus 62 and common or negative bus 25. The values of the resistors 68 and 70 are chosen to maintain the voltage level of the inverting input terminal at approximately one-half the voltage on bus 62 or about 6 volts. The non-inverting input terminal of amplifier 60 is connected through a resistor 72 to one terminal of a switch 74 which, in the illustrative embodiment, represents the water pressure switch 8 of FIG. 1 and is so arranged as to close when water pressure is less than the selected minimum value, e.g., 30 psi, and to open when water pressure is above a selected maximum value, e.g., 60 psi. A second terminal of switch 74 is connected to the voltage bus 62. The resistor 72 and a capacitor 76 form a noise filter at the non-inverting input terminal of amplifier 60. Thus the output of differential amplifier 60 goes high shortly after the pressure switch 74 closes, and low shortly after it opens with the time delay being set by the values of resistor 72 and capacitor 76. A resistor divider comprised of resistors 78 and 80 is connected between the output terminal of amplifier 60 and negative bus 25 to provide an input signal to the microcontroller 42 whenever amplifier 60 is switched. The noise filter provides de-bounced pressure switch closure and opening signals to the microcontroller via amplifier 60 and resistor divider 78, 80.

If the frequency of the excitation applied to motor 40 is allowed to increase significantly above motor speed, slip will become too high, torque will decrease and the motor may stall and draw excessive current. This problem is overcome by reducing frequency as a function of motor current.

A signal proportional to motor or power bridge current is provided by the resistive shunt 29 to a differential amplifier 82 via input resistors 84 and 86 connected from opposite ends of shunt 29 to the inverting and non-inverting input terminals, respectively, of amplifier 82. Filter capacitor 87 in conjunction with resistors 84, 86 slow the response time of the current sensor to prevent over-response to momentary transients. The ratio of the magnitude of a feedback resistor 88 (connected between the output terminal of amplifier 82 and its inverting input terminal) to the magnitude of the input resistor 84 is used to set the gain of amplifier stage 82. The output (or current amplitude) of amplifier 82 is compared to a reference value supplied from the microcontroller 42 by a differential amplifier 90. When the current in the power bridge is higher than the current represented by the reference value, the amplifier 90 will switch so that its output terminal is pulled low. Since the output terminal of amplifier 90 is connected through a diode 92 and a resistor 94 to capacitor 58, the capacitor 58 will be discharged by current flow through resistor 94 and diode 92 to amplifier 90. Resistor 94 is chosen to be smaller in magnitude than charging resistor 64 to ensure that when an overcurrent occurs, the frequency of the power supplied to motor 40 is reduced. As a further feature, the microcontroller 42 can also be programmed to reduce the charge on the capacitor 58 through a diode 96 connected between an output of microcontroller 42 and resistor 94.

As is well known in the induction motor art, if the frequency of the excitation voltage applied to the motor is reduced faster than the motor can slow, the motor will begin to operate as an induction generator transforming kinetic energy to electrical energy. However, since the diode bridge comprising diodes 16–22 cannot handle reverse power, the power generated by the motor results in a continually increasing voltage on the bus capacitor 26, and if allowed to continue may raise the voltage level of the bus to a level high enough to damage the power switches 28–38 of the inverter. To prevent such an event from occurring, the system includes a mechanism for holding or increasing excitation frequency if bus voltage rises above some selected level. In particular, a zener diode 98 and a resistor 100 are serially connected between positive bus 24 and capacitor 58. The voltage rating of the zener diode 98 is chosen to provide a reasonable margin of safety between the maximum allowed value of voltage on bus 24 and the peak voltage rating of the power circuit components 28–38. When the bus 24 voltage exceeds the value selected for the zener diode 98, the current through the diode 98 and resistor 100 provides a charging current to capacitor 58 increasing the frequency of the excitation supplied to the motor 40 and transforming the motor operation from generation to motoring. This system thus forces the deceleration rate to be limited to the rate at which the load (e.g., the pump) on the motor can absorb the kinetic energy.

Generally, in a residential water system supplied by a dedicated pump, a water pressure sensor is employed to switch the pump "ON" and "OFF" in order to maintain the pressure within the residence within specified limits. The difference between the upper and lower pressure limits is often referred to as a hysteresis band. In a typical system, the upper limit may be set at 60 psi and the lower limit at 40 psi. This results in a hysteresis band of 20 psi. In such a system, when the residential water pressure drops to 40 psi, the pressure switch closes and applies energization to the motor driving the water pump. In presently available pump systems, the pressure switch, when it closes, connects the two terminals of a single phase induction motor to the 60 Hz power line and the motor develops a torque which starts at some initial low value and increases as the motor speed increases. Eventually, the motor will reach a speed of about 3500 RPM and the pump will continue to run until the pressure reaches 60 psi. At this point, the pressure switch opens disconnecting the pump motor from the AC power line.

The system of FIG. 2 operates in the same general manner except that the pressure switch is used to signal the controller 42 to initiate application of gating signals to the switching devices 28–38 of inverter 27 in order to provide controlled frequency, three-phase power to motor 40.

When the pressure switch 74 is closed, 12 volts is applied to the noise filter combination of resistor 72 and capacitor 76. The time constant of this RC combination is chosen large enough to suppress noise but sufficiently small that it has no significant influence upon the transient operation of the circuit. Thus, the voltage on capacitor 76 is greater than the voltage at the midpoint of resistors 68 and 70. As a result, the non-inverting input of amplifier 60 is greater than that of the inverting input and the amplifier output voltage transitions to 12 volts. The capacitor 58 begins to charge towards the 12 volt output of amplifier 60. The microcontroller 42 converts the voltage on capacitor 58 to a corresponding frequency and generates the pulse width modulation gating signals that are coupled to the IGBT gate driver circuit 44. The gate driver circuit converts the PWM signals to appropriate values for application to the gate terminals of each of the switching devices 28–38. As the switching devices 28–38 are gated into and out of conduction, the DC voltage appearing across DC bus 14 and 16 is converted to a three-phase voltage for application to the terminals of motor 40. As the current in motor 40 begins to increase, the current through the current sensing resistor 29 increases in direct proportion. The voltage developed across the sensing resistor 29 is amplified by differential amplifier 82 and compared to a desired current level provided by the microcontroller 42 in the differential amplifier 90. So long as the motor current detected by sensor 29 is less than the reference level established by microcontroller 42, the output of amplifier 90 is positive and the diode 92 is reverse biased. However, should the current in the motor 40 exceed the desired level, the output developed by amplifier 90 will go to about zero volts, forward biasing the diode 92 and allowing current to be removed from the capacitor 58 through the series resistor 94 and diode 92. Since the frequency of the excitation applied to the motor is directly proportional to the voltage on capacitor 58, the result will be that the frequency of the excitation will be reduced as the capacitor is discharged. As the motor excitation frequency is reduced, motor slip is reduced and the current in the motor is also reduced. Accordingly, the system of FIG. 2 makes it possible to increase the motor excitation frequency at a rapid rate, for example, one second from zero to full speed, and minimizes the time required for the motor to attain the desired speed.

However, if a ground leakage path, such as path 39, exists when the switching devices are gated into conduction by controller 42, it is possible that the leakage current will be sufficient to create a current flow that can destroy the switching devices. The present invention avoids this problem at initial motor start-up by programming the controller 42 to initially apply a set of relatively short-duration gating pulses in sequence to each of the switching devices 34, 36 and 38. As discussed in the Background, so long as a leakage path does not exist, there will be no current through current detector 29 when these devices are gated into conduction. If a leakage current path does exist, some current will pass through detector 29. Preferably, the initial gating pulses have a duration less than about one millisecond and are desirably about two microseconds so as to limit fault current in the event a very low impedance ground leakage path exists. In order to detect a higher impedance ground leakage path, a second set of gating pulses are applied to each of the switching devices 34, 36 and 38, the second set of gating pulses each having a duration of about four microseconds. Note that there is a delay time between each gating pulse to allow the current detector to respond, the delay time being about 4 microseconds but variable depending on the response time for the current detector circuit as set by the capacitor 87 and resistor 86. If current is detected during either of these initial tests, the controller 42 can provide an alarm, visual or auditory, and inhibit operation of the system. If current is not detected, the controller 42 operates normally and energizes the motor 40.

Figure 3:
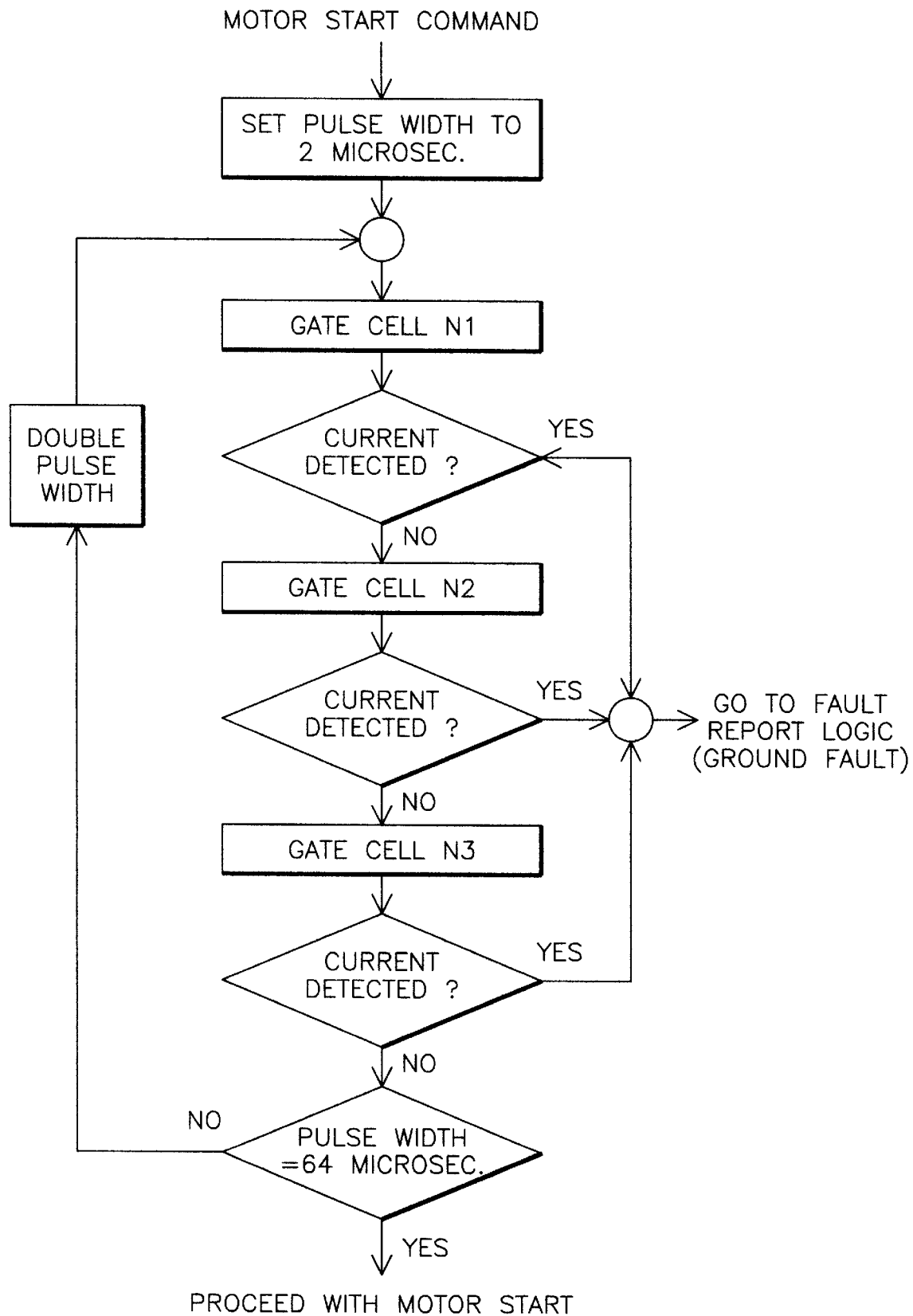
FIG. 3 is a flow chart of a program for implementing the present invention in the system of FIG. 2.

Turning now to FIG. 3, there is shown a simplified flow chart for a computer program implemented in controller 42 to provide the ground fault/ground leakage path test of the present invention. When the switch 12 closes indicating low water pressure and requesting operation of pump motor 40, the resultant signal, indicated as a motor start command, calls a program (sub-routine) which sets the time duration of an initial set of gating pulses to two microseconds, block 110. Controller 42 then sequentially applies a single gating pulse of two microseconds to each of the negative side switching devices (cells) 34, 36 and 38, blocks 112, 114 and 116. After each pulse is applied, a time delay is provided during which the current detector circuit is monitored to determine if any current is generated in detector 29 by any one of the gating pulses, blocks 118, 120 and 122. If at any block 118, 120, 122 current is detected, the controller 42 reports a fault condition, block 124. If no current is detected, the program checks to see what pulse width gating pulse was applied, block 126, and, if a two microsecond pulse, steps to block 128 to increase the pulse width and re-run the fault detection test. If no current is detected the second time through the program, the controller 42 again doubles the pulse width and repeats the sequential tests. For the illustrative example, the pulse width is double and testing repeated until the pulse duration is 64 microseconds. However, the pulse width is determined by characteristics of the load and circuit and may be set for more or less than 64 microseconds. Once the tests have been completed successfully, the controller exits the sub-routine and proceeds with normal motor start.

While FIG. 3 suggests that a two microsecond gating pulse is preferable, it will be recognized that the pulse duration is a function of the system characteristics and the switching device operation. Similarly, for high impedance faults, a pulse width greater than four microseconds may be desirable. In general, it is believed that an exemplary system will require a pulse width which does not exceed about one millisecond. Further, while two steps are used to identify high and low impedance faults, it may be preferable to use more than two steps, particularly where the first two sets of gating pulses are two and four microseconds in duration. For example, a third step using a one millisecond gating pulse might be useful in identifying very high impedance leakage paths.

In general, ground detection circuitry is used for personnel safety considerations and must be able to detect leakage currents which are less that the magnitude considered to be lethal. This system is not intended to function as a safety device, but rather as a protective device to prevent damage to the unit should leakage to ground occur. If a ground exists and the contractor fails to check for grounds before energizing the system, the controller will be damaged and require replacement. Should he fail to realize that the cause of the failure is a ground in the system, he may install and similarly destroy a replacement. Thus it becomes important to incorporate some form of protection against failures induced by ground faults.

While the invention has been described in what is presently considered to be a preferred embodiment, many variations and modifications will become apparent to those skilled in the art. Accordingly, it is intended that the invention not be limited to the specific illustrative embodiment but be interpreted within the full spirit and scope of the appended claims.

What is claimed is:

1. A method for detecting the presence of a ground leakage path in an electric motor system including an alternating current (ac) electric motor coupled for receiving electric power from a switching inverter of the type having, for each phase of the motor, a pair of serially connected electronic switching devices connected between relatively positive and negative direct current (dc) voltage buses, the switching devices being alternately gated into and out of conduction for providing switched electric power to the motor, the inverter including a current detector for detecting current in the relatively negative voltage bus, the method including the step of initially applying a gating pulse each time the motor is energized to the switching device connected to the negative voltage bus and identifying a ground leakage path when such gating pulse produces current at the current detector.

2. The method of claim 1 and including the step of limiting the time duration of the gating pulse to less than one millisecond.

3. The method of claim 2 and including the step of applying a second gating pulse to the switching device connected to the negative voltage bus when current is not detected after application of the first gating pulse, the second gating pulse being of longer time duration than the first gating pulse.

4. The method of claim 1 wherein the motor has a plurality of phases and including the step of providing a time delay between each gating pulse to allow the current detector to respond to energization of each switching device.

5. The method of claim 1 and including a water pump connected to be driven by the motor and wherein the water pump and motor in combination are placed in a well below a nominal water table.

6. The method of claim 2 and including the steps of repeating the step of applying gating pulses to the switching device for each of a plurality of applications wherein the pulse width of the gating pulses is increased for each sequential step up to a selected maximum pulse width when current is not detected in any one of the applications.

7. Apparatus for detecting the presence of a ground leakage path in an electric motor system including an alternating current (ac) electric motor coupled for receiving electric power from a switching inverter of the type having, for each phase of the motor, a pair of electronic switching devices serially connected between relatively positive and negative direct current (dc) voltage buses, a junction intermediate each pair of switching devices being coupled to a corresponding phase winding of the motor and the switching devices being alternately gated into and out of conduction for providing switched electric power to the motor, the inverter including a current detector for detecting current in the relatively negative voltage bus, the apparatus including a microprocessor controlled gate pulse generator for initially applying a gating pulse each time the motor is energized to the one of the switching devices connected to the negative voltage bus for each pair of switching devices, in sequence, for effecting conduction of each such switching device, said apparatus further including a circuit for monitoring current in the current detector and for providing a signal indicative of a ground leakage path when such gating pulse produces current at the current detector.

8. The apparatus of claim 1 wherein said microprocessor is operable to limit the time duration of each initially applied gating pulse to less than one millisecond.

9. The apparatus of claim 2 wherein said microprocessor is operable to apply, in sequence, a second gating pulse to each of the switching devices connected to the negative voltage bus when current is not detected after application of the initially applied gating pulse, the second gating pulse being of longer time duration than the initially applied gating pulse.

10. The apparatus of claim 1 wherein the motor has a plurality of phases and said microprocessor is operable to insert a time delay between each of said gating pulses sufficient to allow the current monitoring circuit to respond to any ground leakage current in the current detector.

11. The apparatus of claim 1 and including a water pump connected to be driven by the motor, the water pump and motor in combination being placed in a well below a nominal water table.

12. The apparatus of claim 2 wherein the microprocessor is operable to apply gating pulses to each said one of the switching devices for each of a plurality of time spaced applications of the gating pulses and wherein the pulse width of the gating pulses is increased for each sequential application until the pulse width reaches a selected maximum time duration without current being detected during any one of the applications, said microprocessor thereafter initiating gating of the switching devices in a manner to cause the motor to run.

13. A water pumping system including a water pump driven by a three phase, alternating current (ac) electric motor having three phase input terminals, each of the pump and motor being adapted for positioning in a well below a water table, the system further including a microprocessor based controller for controlling operation of the motor, a rectifier circuit for converting ac electric utility power to direct current (dc) electric power on a dc link comprising a pair of relatively positive and relatively negative dc buses, a three phase inverter having positive and negative dc input terminals connected to respective ones of the positive and negative dc buses, the inverter comprising at least three sets of controllable electronic switching devices, each set comprising a first and a second switching device connected in series between the positive and negative buses with a respective one of the phase terminals of the motor being connected to a junction intermediate the first and second switching devices, the controller being connected for supplying gating pulses to each of the switching devices in a manner to effect conduction of selected ones of the devices so as to generate controlled frequency ac excitation of the motor, a current monitoring circuit coupled for monitoring current in the negative voltage bus, the controller being responsive to a command for operation of the pump for initially sequentially gating into conduction, for a time period less than one millisecond, each of the second switching devices connected between a respective phase winding and the negative dc bus and for inhibiting operation of the motor upon detection of current by said monitoring circuit during said initial gating sequence.

14. The system of claim 13 wherein the controller is operative to gate the second switching devices into conduction for sequentially longer time periods up to a maximum selected time period and to inhibit motor operation when current is detected by the monitoring circuit in response to conduction of any one of the switching devices.

\* \* \* \* \*